United States Patent
Schramm et al.

(10) Patent No.: US 6,395,151 B1
(45) Date of Patent: May 28, 2002

(54) VACUUM ARC VAPOR DEPOSITION METHOD AND APPARATUS FOR APPLYING IDENTIFICATION SYMBOLS TO SUBSTRATES

(75) Inventors: Harry F. Schramm, Winchester, TN (US); Donald L. Roxby, Gurley; Jack L. Weeks, Scottsboro, both of AL (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 09/703,029

(22) Filed: Oct. 26, 2000

(51) Int. Cl.[7] .......................... C23C 14/32; C23C 16/00
(52) U.S. Cl. ........................... 204/192.38; 204/298.41; 118/723 VE; 427/540; 427/580
(58) Field of Search ................ 204/192.38, 298.41; 445/72; 118/723 VE; 427/540, 586

(56) References Cited

U.S. PATENT DOCUMENTS 4,505,948 A * 3/1985 Pinkhasov ................... 427/580
5,258,264 A * 11/1993 Mathad et al. ............... 430/315
5,391,275 A * 2/1995 Mintz ..................... 204/192.32
5,482,734 A * 1/1996 Herwig et al. ................ 427/8
5,730,637 A * 3/1998 Suzuki et al. ................ 445/49

* cited by examiner

Primary Examiner—Rodney G. McDonald
Assistant Examiner—Gregg Cantelmo
(74) Attorney, Agent, or Firm—James J. McGroary

(57) ABSTRACT

An apparatus for applying permanent markings onto products using a Vacuum Arc Vapor Deposition (VAVD) marker by accelerating atoms or molecules from a vaporization source onto a substrate to form human and/or machine-readable part identification marking that can be detected optically or via a sensing device like x-ray, thermal imagining, ultrasound, magneto-optic, micro-power impulse radar, capacitance, or other similar sensing means. The apparatus includes a housing with a nozzle having a marking end. A chamber having an electrode, a vacuum port and a charge is located within the housing. The charge is activated by the electrode in a vacuum environment and deposited onto a substrate at the marking end of the nozzle. The apparatus may be a hand-held device or be disconnected from the handle and mounted to a robot or fixed station.

18 Claims, 3 Drawing Sheets

VACUUM ARC VAPOR DEPOSITION METHOD AND APPARATUS FOR APPLYING IDENTIFICATION SYMBOLS TO SUBSTRATES

ORIGIN OF THE INVENTION

This invention was made by an employee of the United States Government and may be manufactured and used by or for the Government for governmental purposes without the payment of any royalties thereon or thereof.

BACKGROUND OF THE INVENTION (1) Field of the Invention

This invention relates to the method of depositing thin films as a means to apply safe permanent human and/or machine-readable identification markings to the surfaces of materials that do not outgas in a vacuum environment, and specifically to apparatus for applying these markings.

(2) Description of the Related Art

Industry utilizes part identification markings to identify parts and components. The use of machine readable binary codes in the form of matrix representations is described in U.S. Pat. No. 5,380,415. A wide range of marking methods has been developed for his purpose including means to apply machine-readable symbols used for automatic data collection. These methods involve the use of attached identification means such as adhesive backed labels and tapes, bands, tags, identification plates and direct part markings (DPM) which are applied to, or formed by altering a surface of a part.

DPM is generally recommended in applications where: 1) traceability is required after the product is separated from its temporary identification, such as marked packaging, 2) the part is too small to be marked with a bar code labels or tags, or 3) the part is subjected to environmental conditions that preclude the use of an attached identification means that will not survive those conditions.

DPM can generally be subdivided into two general categories: non-intrusive and intrusive. Intrusive marking, methods alter a surface by abrasion, cutting, burning, vaporizing or other destructive means. Intrusive marking methods include methods such as micro-abrasive blast, dot peening, electrochemical etch, machine engraving, milling, laser etching and engraving or other similar marking methods.

Non-intrusive markings, also known as additive markings, can be produced as part of the manufacturing, process, such as cast, forge or mold operations, or by adding, a layer of media to a surface using methods that have no adverse effects on material properties. Examples of additive markings would include ink jet printing, silk screening, stenciling or other similar marking methods.

While both non-intrusive and intrusive marking methods are widely used in industry, their applications are limited. Non-intrusive markings are not generally used in applications associated with harsh environments. For instance, ink marking would not be used to mark engine components because the high heat experienced by the part would burn off the marking media. Intrusive markings, which are designed to survive harsh environments, may be considered to be controlled defects in high stress applications and could degrade material properties beyond a point of acceptability.

Some intrusive markings, especially those done by lasers, are generally not used in safety critical applications without appropriate metallurgical testing and engineering approval. Safety critical applications include parts whose failure could result in hazardous conditions. Examples of safety critical applications include systems related to aircraft propulsion, vehicle control, equipment handling, high pressure, pyrotechnics, and nuclear, biological and chemical containment applications. An example of an inappropriate use of an intrusive marking would be the laser etching of an engine turbine blade in a critical stress location. Although safe settings could be established through metallurgical testing, there remains a risk of input errors when entering settings. For example, an input error made during a turbine blade marking operation could result in the application of a mark that is applied with too much heat, resulting in micro-cracks that could propagate under stress over time. Unknown defects in engine blades could result in part failures leading to catastrophic engine loss and subsequent loss of aircraft and personnel.

The aerospace industry has been seeking new marking methods that are safe and that can withstand harsh environments. The National Aeronautics and Space Administration (NASA) investigated a number of methods to spray and bond particles consisting of atoms and ions of source material onto surfaces. These included plasma-activated chemical vapor deposition, laser chemical deposition, sputtering, cathode-spot arc coating, electron beam evaporation deposition, ion plating, arc evaporation and cathode arc plasma deposition. However, all of the known processes tend to have relatively slow deposition rates compared to non-vapor coating methods. Consequently, NASA developed a Vacuum Arc Vapor Depression (VAVD) apparatus, as described in U.S. Pat. No. 5,380,415, consisting of a vacuum chamber system for producing vapor deposits. It utilizes the arc formed in a gas flowing through a hollow tungsten electrode in a substantially vacuum environment. The VAVD process is capable of high deposition rates and produces no hazardous wastes or by-products.

Tests conducted using the VAVD apparatus produced high quality thin film coatings including small, high fidelity human and machine-readable part identification symbols in seconds. This activity however, was deemed impractical for use because the size and operation of the vacuum chamber limited both the size and volume of parts being marked and required operation within a vacuum chamber.

SUMMARY OF THE INVENTION

Consequently, it is a primary object of the present invention to provide a marking apparatus and method that can be used to produce human and/or machine readable identification markings by applying thin films of material onto surfaces using Vacuum Arc Vapor Deposition technology.

Another object of the present invention is to provide a means to apply thin film deposition identification marks to a surface using a mask to form a representation of a human or machine-readable part identification symbol, said symbol preferably being a Data Matrix Symbol.

A further object of the present invention is to provide a means to apply a thin film identification mark of contrasting color to a surface, the area of which is limited to the size of the desired mark, that is subsequently selectively removed using a separate device that becomes a marker, such as a laser, to form a representation of a part identification marking symbol, the symbol marking being captured and decoded using an optical reader fitted with a light detector like a charged-coupled device (CCD) or complementary metal-oxide semi-conductor (CMOS).

A still further object of the invention involves the addition of a removable coating to a surface, the area of which is limited to the size of the desired mark, using ink jet, laser bonding, or similar marking technique to form a mask to block the VAVD coating process, said coating being subsequently removed to expose a representation of a part identification symbol or other desired marking.

It is yet another object of present invention to provide a thin film coating applied to a surface, the area of which is limited to the size of the desired mark, that exhibits a difference in density, reflectivity, absorption or other variance to promote the capture and decoding of a part identification marking, using a image sensing reader, said sensing means including but are not limited to, capacitance, magneto-optic, micro-power impulse radar, thermal, IR, x-ray, and ultrasound.

Still another object of the present invention provides a symbol which represents a human and/or machine readable identification marking, and which exhibits a difference in density, reflectivity, absorption or other variance which is optionally covered with a coating so as to hide the mark for aesthetic or security reasons and then capturing the symbol with a sensing reader and decoder to yield human-readable information.

The present invention relates to a method and apparatus for applying symbols by using VAVD technology. The apparatus may be a hand-held device or mounted to a robot or fixed station. The apparatus is adapted to be used in a manufacturing or other environment. The apparatus preferably contains a housing. The housing contains a chamber housing an electrode, a charge and a vacuum port fixed with a deformable nozzle. A mask is placed between the nozzle and a substrate to be marked. With the nozzle sealed against the mask and/or substrate, a vacuum is drawn in the chamber. Next, the charge is at least partially vaporized by the electrode allowing the vapor to deposit on the portion of the substrate exposed through the mask. The apparatus may be hand-held or may be a fixed component in a manufacturing facility or other location. Some of the materials deposited using the VAVD process include pure metals such as aluminum, chromium, gold, molybdenum, nickel, silver, stainless steel, titanium and tungsten. Commonly used alloys include stainless steel, nickel-chromium, lead, tin and M—Cr—Al—Y. Typical compounds used in the process include $Al_2O_3$, TiC and $TiB_2$.

The present invention overcomes many of the drawbacks and disadvantages of known marking methods and similar thin film deposition devices. One object of the preferred embodiment is to provide a means to clean and prepare a surface prior to applying a thin film deposition identification marking. The cleaning device preferably utilizes a high frequency generator and a cathode ring in close proximity to the part surface. This cleaning method removes contaminants and oxides from the area that will contain the identification mark.

In another use of the present invention, a matte finish thin film coating is applied to a surface, the area of which is limited to the size of the desired mark, to reduce the amount of glare radiating from a surface, thereby improving the readability of a machine-readable symbol using optical readers.

In still another use of the present invention, a thin film of clear metal can be deposited over an identification mark, the area of which is limited to the size of the desired mark, to provide protection from adverse environmental conditions.

BRIEF DESCRIPTION OF THE DRAWINGS

The particular features and advantages of the invention as well as other objects will become apparent from the following, description taken in conjunction with the accompanying drawings wherein.

DETAILED DESCRIPTION OF THE PREFERRED EMBODIMENT

The Vacuum Arc Vapor Deposition marking method and apparatus of the present invention can be used to apply graphical representations, human-readable characters, and a wide range of different machine-readable identification symbols to both metallic and non-metallic surfaces. The preferred symbol is a matrix symbol is described in detail in U.S. Pat. No. 4,939,354. In the matrix code format, black squares (data cells) represent a binary "1" and white data cells represent a binary "0". When these binary values are used together in specific sequences, they represent alphanumeric characters. Some advantages of using data matrices for identification include:

(1) Equal-sized data cells provide for an easier decoding logic decision process than for bar codes; (2) by knowing the size and shape of a symbol and its individual data cells, decoding software can quickly reconstruct damaged portions of the code; (3) matrix symbols can be produced in both square and rectangular format and scaled in size to fit into an available marking area, (4) matrix codes designed to be applied to any of a variety of articles and products, (5) a matrix code can store from one to 2335 alphanumeric characters in any language, (6) an encoding scheme for use with such a symbol has a high degree of redundancy that permits most marking defects to be overcome (i.e., 16-bit cyclic redundancy check and data reconstruction capabilities are included in one version; and Reed-Solomon error correction is included in another), (7) up to 16 symbols can be concatenated, (8) error correction and checking (ECC) code 200 is preferred; and (9) at least some Data Matrix symbols have been placed in the public domain and recommended by the American National Standards Institute (ANSI) for use in direct part marking.

Figure 1:
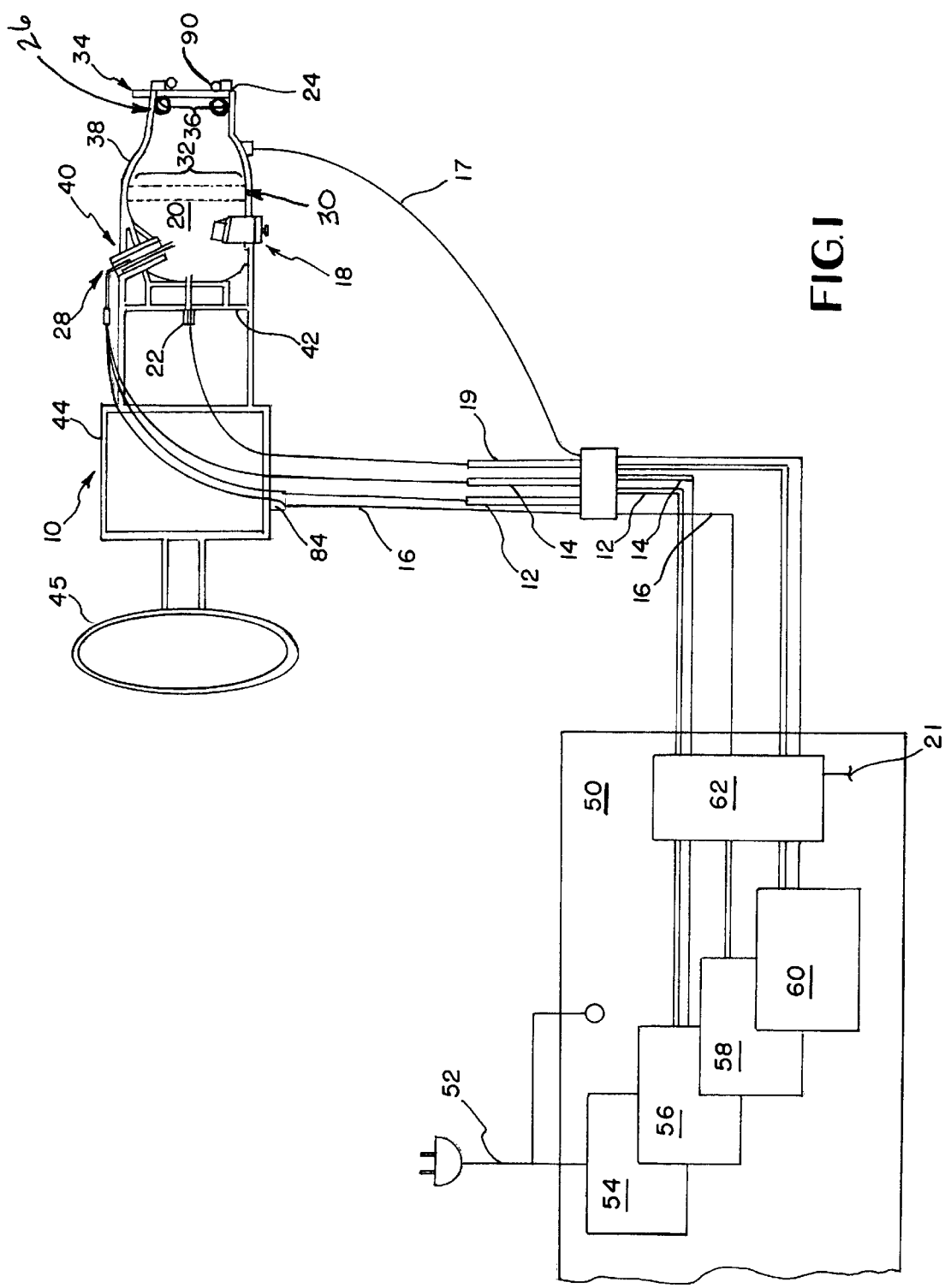
FIG. 1 is a diagrammatic sectional view of the marking apparatus constructed in accordance with the present invention.

FIG. 1 provides a diagrammatic view of the basic components of the marking device 10. Although all components may not be required in all applications, the preferred embodiment includes: a welding power and water lead 12, a return water lead 14, a gas lead 16, a vacuum line 17, an anode assembly 18, a backfill vent line 19, a vacuum chamber area 20, a back fill vacuum port 22, a seal 24, a cleaning device 26, a cathode assembly 28, or welding torch, a quick disconnect removable front end 30 with aperture 32 sized to the desired exposure area, a shutter control device 34 used to isolate the vacuum chamber with shutter 36 during cycle on and off 34. A housing 40 with a nozzle 38 contains many of the components of the marking device and may be mounted to an apparatus 44 such as a hand-held device or fixed station mounting. The hand-held version is the presently preferred embodiment.

The marking device 10 is connected to a controller 50 which may-be connected to a conventional 110 volt outlet with plug 52. The controller 50 preferably includes a grounded power supply 54, water recirculation pump 56, gas supply 58, vacuum pump 60 and a timer 62 that sequences the operation of the pumps 56, 60, gas supply 58, and ultrasonic cleaner 26 and electrode assembly 28, the latter being portions of the device 10, to be described in greater detail as follows.

Figure 2:
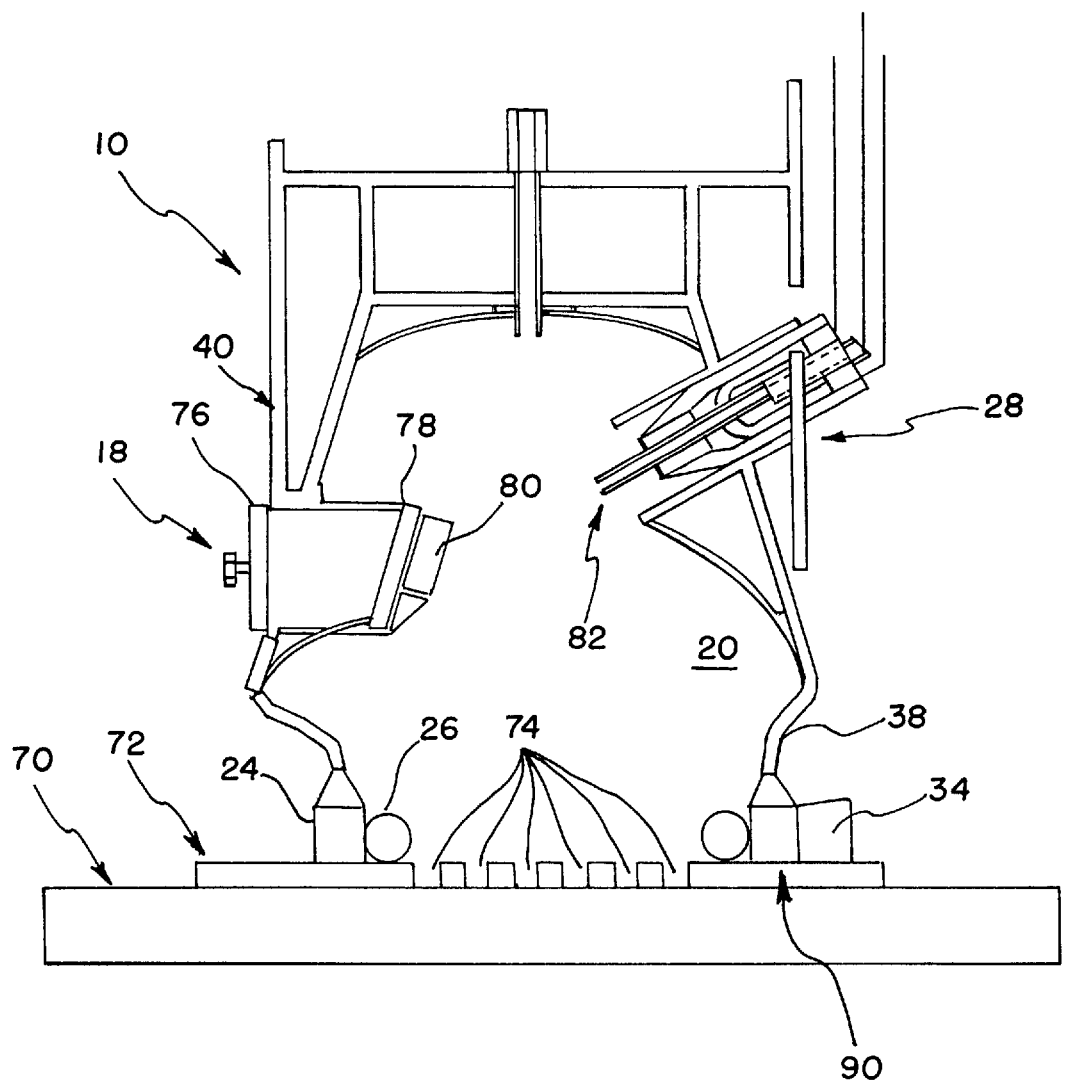
FIG. 2 provides a diagrammatic sectional view of a portion of the marking apparatus illustrated in FIG. 1 positioned to coat a product in accordance with the principles of the present invention.

Referring now to FIG. 2, to operate the system, the marking apparatus 10 is positioned over a substrate 70 covered with a mask 72 containing openings 74 that assist to form a representation of a marking on the substrate 70 such as the codes illustrated and described in U.S. Pat. No. 4,939,354 or other symbols. Masks 72 may include mechanical or laser cut stencils having openings 74 to allow deposition through the opening 74 in the desired shape of a symbol on the substrate 70. Silk screening impressions may also be utilized as a mask 72 using photographic or thermal printing processes. Other mask types may also be utilized.

The marking process may begin with the loading of the anode assembly 18 of the marking device 10. Loading drawer 76, illustrated in the housing 40 is placed in the open position. Inside the drawer 76 is a holder 78 designed to hold a small amount of sacrificial material 80. The holder is preferably ceramic with conductive element. The material 80 is commonly called a charge and can be in the form of chunks, wire, slugs, and so on. After the charge is inserted, the drawer 76 is pushed to the closed position. The holder 78 is placed proximate to the anode assembly 18 and cathode 28 is used to create the metallic vapor used in the coating process. The material used in the marking device 10 may be similar to that described in U.S. Pat. No. 5,380,415.

As illustrated in FIG. 2, after loading, the marker nozzle 38 is pressed down upon a substrate or a mask at its marking end 90 to create a seal between the nozzle seal 24 and the substrate 70 to form a substantially airtight compartment 20. While depressing, the nozzle 38 to the surface, the controller 60 is activated to begin the marking process. The nozzle 38 may be deformable as illustrated.

The marking process preferably begins with the activation of the cleaner 26 and the vacuum pump 56. The cleaning device 26 preferably consists of a ring attached to the inside of the nozzle 38 that is connected to a high-frequency generation transducer 84 that generates an ultrasonic wave to loosen impurities from the substrate. The vacuum pump 56 draws impurities from the surface along with a substantial portion of ambient air out through vacuum port 17 from the chamber 20 leaving a clear path of flow for the thin film vapor generated by the marking device 10. Pressure within the vacuum chamber 20 is preferably 25 microns or less after drawing the vacuum.

A small amount of inert gas, such as argon, is injected into the chamber 20 to serve as the ionization medium that allows an arc to be sustained in the vacuum environment. The argon may be provided through cathode assembly 28 or otherwise. After the flow of gas is released, a high-current, low voltage arc is produced between the slightly separated charge (anode) 80 and the electrode 82 of cathode assembly 28 to create a blast of ionized metal vapor plasma at minute hot 3spots on the charge 80. The resulting, plasma is typically accelerated onto the item to be marked at directed energies of 25–150 eV. The typical plasma temperature is approximately 3 eV. The plasma striking the object to be marked forms an amorphous film that can range in thickness from angstroms to several thousandths of an inch, depending upon the length of the firing time and current used.

If used as a fixed station marking device, robot mechanism 45 may be used to position the marking device 10 relative to the substrate 70. Fixed station uses maybe efficient in high volume part marking applications. Otherwise the marking device 10 may be portable as a hand held device or any other desired configuration.

Film coatings may include a matte finish coating to reduce the amount of glare radiating from the substrate after deposition of the desired mark. The matte finish may prove the readability of a machine-readable symbol using optical readers. Film coatings may exhibit different density, reflectivity, absorption or other variance to assist in the capture and decoding of a part identification marking, using capacitance, magneto-optic, micro-power impulse radar, thermal (IR), x-ray, ultrasound or other similar sensing apparatus. Additionally, a thin film of clear metal maybe applied to a substrate to provide protection from adverse environmental conditions.

Figure 3:
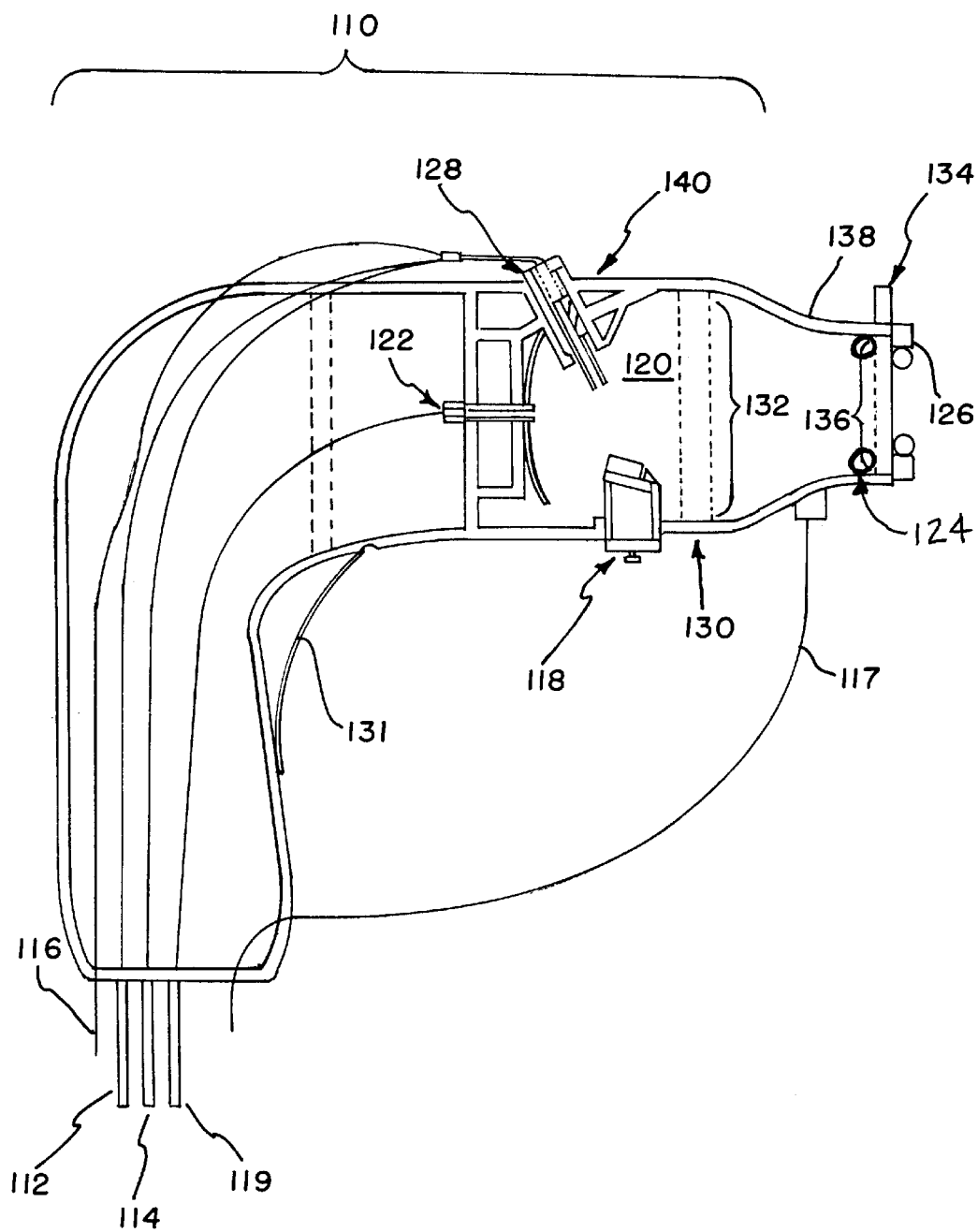
FIG. 3 is a hand-held version of a marking apparatus similar to that of FIG. 1.

A second, and presently more preferred, embodiment of the marking device is illustrated as a hand-held unit 110 in FIG. 3. This embodiment includes: a welding power and water lead 112, a return water lead 114, a gas lead 116, a vacuum line 117, and a back fill vent line 119. These lines connect with the welding power and water lead 12, return water lead 14, gas lead 16, vacuum line 17 and back fill vent line 19 of FIG. 1 when used as a hand-held embodiment. The hand-held unit 110 also includes a trigger 131 which may be utilized to begin the marking process and/or to activate the cathode assembly 128. This embodiment also preferably includes back fill vacuum port 122, vacuum chamber area 120, anode assembly 118, cleaning device 124, seal 126, cathode assembly 128, removable front end 130, aperture 132, shutter control device 134, housing 140 and nozzle 138.

Numerous alternations of the structure herein disclosed will suggest themselves to those skilled in the art. However, it is to be understood that the present disclosure relates to the preferred embodiment of the invention which is for purposes of illustration only and not to be construed as a limitation of the invention. All such modifications which do not depart from the spirit of the invention are intended to be included within the scope of the appended claims.

Having, thus set forth the nature of the invention, what is claimed herein is:

1. A vacuum arc vapor deposition device for applying a thin film coating as an identification mark by depositing vapors from a source onto a substrate spaced from said source, said apparatus comprising:

a housing having a nozzle, said housing including a chamber therein connected to a vacuum source at a vacuum port, said nozzle having a marking end, an electrode located in said chamber, an ultrasonic cleaning device connected to the nozzle, a power source connected to said electrode, and a material holder disposed relative to said electrode in said chamber supplying a charge as the source.

2. The marking device as recited in claim 1, wherein the nozzle is at least partially deformable.

3. The marking device as recited in claim 1, further comprising a mask located between the nozzle and the substrate.

4. The marking device as recited in claim 3, wherein the mask is a stencil.

5. The marking device as recited in claim 1, wherein the cleaning device is further comprised of a ring connected to the nozzle coupled to a high-frequency transducer.

6. The marking device as recited in claim 1, further comprising a gas source connected to the chamber in the housing wherein a gas may be selectively dispensed to the chamber from the gas source.

7. The marking device as recited in claim 6, wherein the gas is argon.

8. The marking device as recited in claim 1, further comprising a controller in communication with the electrode.

9. The marking device as recited in claim 8, wherein the vacuum source is a vacuum pump in communication with the controller.

10. The marking device as recited in claim 1, wherein the housing contains a connector for mounting to a moveable base.

11. The marking device as recited in claim 1, further comprising a robotic mechanism connected to the housing.

12. The marking device as recited in claim 1, wherein the electrode is a cathode.

13. The marking device as recited in claim 3, further comprising a seal located at the marking end of the nozzle.

14. The marking device as recited in claim 13, wherein the seal is adapted to form an air tight connection between one of the mask and substrate when a vacuum is drawn in the chamber.

15. The vacuum arc deposition device of claim 1 wherein the housing is hand-held.

16. A method for applying a film coating as an identification mark by depositing vapors from a charge onto a substrate spaced from said charge, said method comprising the steps of:

(a) providing a hand-held vacuum arc vapor deposition device having a housing with a nozzle, said housing having a chamber therein with a vacuum port connecting a vacuum source to the chamber, said housing having an electrode assembly with an electrode located within the chamber, said nozzle having a marking end and an ultrasonic cleaner;

(b) placing the marking end of the nozzle upon the substrate, and then (c) activating the ultrasonic cleaner and removing air from the chamber through the vacuum port; and (d) activating the charge with the electrode to produce a vapor in the chamber wherein at least some of the vapor is deposited on the substrate through at the marking end of the nozzle.

17. The method of claim 16 further comprising the step of locating a mask between the charge and the substrate before activating the charge.

18. The method of claim 16 further comprising the step of loading the charge in an anode assembly connected to the housing proximate to the electrode assembly.

* * * * *